United States Patent [19]

Tokuda et al.

[11] Patent Number: 4,737,775
[45] Date of Patent: Apr. 12, 1988

[54] INSULATION DETERIORATION MONITORING APPARATUS

[75] Inventors: Takao Tokuda, Yokohama; Hisashi Suwahara, Tokyo; Yasuaki Nozu, Fujisawa, all of Japan

[73] Assignee: Kabushiki Kaisha Meidensha, Tokyo, Japan

[21] Appl. No.: 806,675

[22] Filed: Dec. 9, 1985

[30] Foreign Application Priority Data

Dec. 14, 1984 [JP] Japan .................. 59-188801[U]
Dec. 14, 1984 [JP] Japan .................. 59-188802[U]

[51] Int. Cl.⁴ .......................................... G08B 21/00
[52] U.S. Cl. .................................. 340/647; 324/547; 340/646
[58] Field of Search ............... 340/647, 646; 324/51, 324/54, 96, 547; 174/143, 11 BH

[56] References Cited

U.S. PATENT DOCUMENTS

| | | | |
|---|---|---|---|
| 3,324,393 | 6/1967 | Casey et al. | 324/96 |
| 3,419,802 | 12/1968 | Pelenc et al. | 324/96 |
| 3,419,803 | 12/1968 | Pelenc et al. | 324/96 |
| 3,502,978 | 3/1970 | Bernard et al. | 324/96 |
| 3,581,202 | 5/1971 | Pelenc et al. | 324/96 |
| 3,675,125 | 7/1972 | Jaecklin | 324/96 |
| 3,983,477 | 9/1976 | Stuchley et al. | 324/117 R |
| 4,398,187 | 8/1983 | Fukushima et al. | 340/626 |
| 4,410,851 | 10/1983 | Goffaux | 324/54 |

FOREIGN PATENT DOCUMENTS

| | | |
|---|---|---|
| 0038790 | 10/1981 | European Pat. Off. . |
| 0067683 | 12/1982 | European Pat. Off. . |
| 1004731 | 10/1957 | Fed. Rep. of Germany . |
| 55-83411 | 6/1980 | Japan . |
| 57-183244 | 11/1981 | Japan . |
| 58-43162 | 3/1983 | Japan . |
| 58-193471 | 11/1983 | Japan . |

OTHER PUBLICATIONS

Austrian Journal, Elektronik und Maschinenbau, vol. 97, No. 7, Jul. 1980, pp. 275-279.

*Primary Examiner*—James L. Rowland
*Assistant Examiner*—Jeffery A. Hofsass
*Attorney, Agent, or Firm*—Bachman & LaPointe

[57] ABSTRACT

The apparatus for monitoring an insulation deterioration of an insulation layer surrounding an outer surface of a coil conductor comprises a semiconductor layer of $10^2$ to $10^7$ ohm-cm formed within the insulation layer of the coil, an electric field sensor such as Pockels element or ferroelectric element mounted on the coil insulation layer. The semiconductor layer is so formed as to divide the insulation layer into inner and outer layers. When the inner layer deteriorates, a high electric field is sensed, while the outer layer deteriorates, a low electric field is sensed. Therefore, it is possible to discriminate the insulation deterioration positions on the basis of the change in electric field detected by the sensor element. In case of deterioration, alarms are produced or the power supply of machine is turned off for safety.

23 Claims, 9 Drawing Sheets

FIG. I(A)
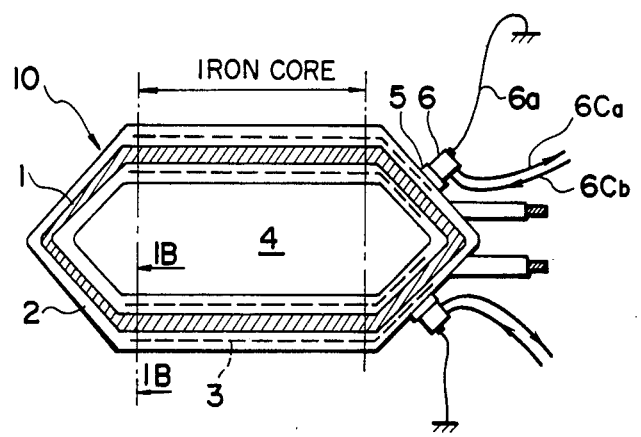
FIG. I(B)  FIG. I(C)  FIG. I(D)
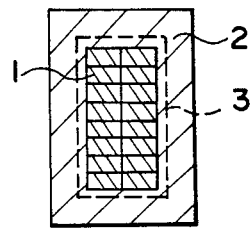 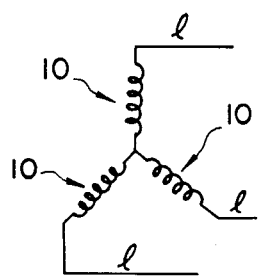 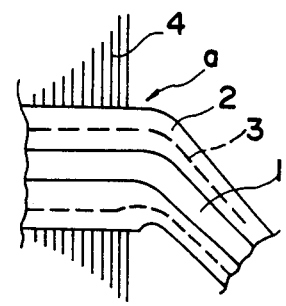

FIG. 12
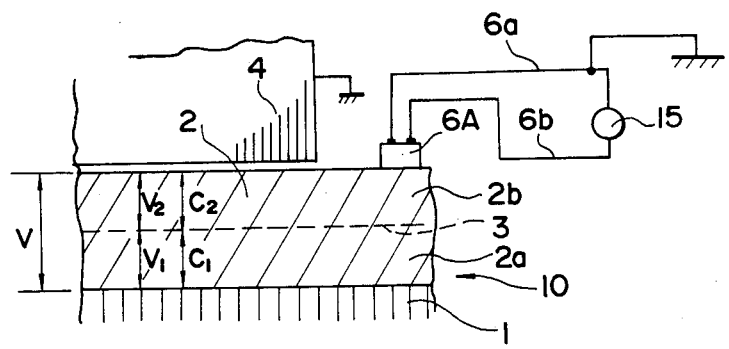
FIG. 13 (A)  FIG. 13 (B)
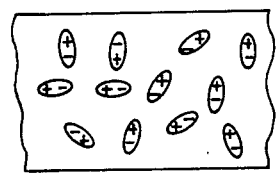 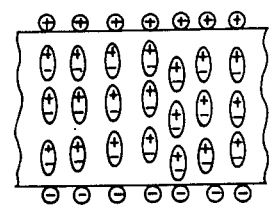

INSULATION DETERIORATION MONITORING APPARATUS

BACKGROUND OF THE INVENTION

1. Field of the Invention

The present invention relates generally to an insulation deterioration monitoring apparatus and more specifically to an apparatus for monitoring the insulation deterioration of high voltage coils provided for high voltage machines such as induction motors, generators, etc.

2. Description of the Prior Art

The background of the present invention will be explained with respect to its application to coils engaged with an iron core of a high voltage rotating machine. Within an insulating layer formed on a high voltage coil, gaps such as voids or exfoliation readily occur for some reason or other in the manufacturing processes or due to cooling and heating cycles during operation (machines are heated in operation and cooled at rest). These gaps will cause partial electric discharge whenever a high electric field is applied. Once the partial discharge occurs, the coil insulating layer is eroded gradually, while reducing the dielectric strength, resulting in a serious dielectric breakdown accident finally.

In order to solve the above problems, although it may be possible to reduce the partial electric discharge generated within the insulation layer by eliminating the gaps formed in the insulation layer, it is usually very difficult to completely eliminate the gaps when considering various causes.

Therefore, the insulation characteristics are sufficiently inspected for each coil independently and further the insulation characteristics of the whole coil assembly are inspected after each coil has been engaged with the iron core, connected to each other, and treated by varnish coating process.

However, the above inspection is made for checking the initial manufacturing defective. Since the insulation deterioration according to a change with passage of time starts after operation, it is very important to inspect a change with passage of time in insulation characteristics after or during operation. Conventionally, there exists a problem in that a change with passage of time in insulation characteristics should be inspected after the machine has been stopped during operation. Therefore, the time interval between inspections inevitably be increased and it is impossible to grasp the insulation characteristics accurately at all times, thus resulting in an occurrence of an unexpected serious accident. Therefore, there exists a strong demand for establishing a technique for insulation diagnoses in the state where the machine is in operation.

SUMMARY OF THE INVENTION

With these problems in mind, therefore, it is the primary object of the present invention to provide an insulation deterioration monitoring apparatus by which deterioration in the coil insulation layer can reliably be monitored easily at all times, even after the coils have already been assembled with an iron core or while the machine is in operation.

There is provided, in accordance with the invention, an apparatus for use with an electric coil having a coil conductor, an iron core, and an electric insulator provided between the coil conductor and the iron core for providing a predetermined degree of electric insulation therebetween. The apparatus comprises a semiconductor layer provided at least in a portion of the electric insulator to divide the electric insulator portion into outer and inner layers. A sensor is provided on the coil. The sensor is sensitive to an electric filed existing therearound for producing a sensor signal indicative of a sensed electric field intensity when a voltage is applied between the coil conductor and the iron core. The apparatus also includes a detector responsive to the sensor signal for detecting a deterioration of the electric insulation of the electric insulator.

BRIEF DESCRIPTION OF THE DRAWINGS

The features and advantages of the insulation deterioration monitoring apparatus according to the present invention will be more clearly appreciated from the following description of the preferred embodiments of the invention taken in conjunction with the accompanying drawings in which like reference numerals designate the same or similar elements or sections throughout the figures thereof and in which:

FIG. 1A is a diagrammatical cross-sectional view, partly side view, showing a first embodiment of the monitoring apparatus according to the present invention, in which a semiconductor layer and an electric field sensor of Pockels type are provided for a coil;

FIG. 1B is an enlarged diagrammatical cross-sectional view of the coil shown in FIG. 1A;

FIG. 1C is a schematic diagram showing a Y-connection of coils by way of example;

FIG. 1D is an enlarged partial cross-sectional view showing the coil end disposed near an edge of an iron core;

FIG. 12 shows an equivalent circuit of the semiconductor layer and the insulation layer and a schematic diagram showing a second embodiment of the monitoring apparatus according to the present invention, in which a semiconductor layer and an electric field sensor of ferroelectric type are provided for a coil;

FIGS. 13(a) and (b) are illustrations showing the principle of the ferroelectric electric field sensor, in which a number of spontaneous polarization domains are shown.

DETAILED DESCRIPTION OF THE PREFERRED EMBODIMENTS

Figure 2:
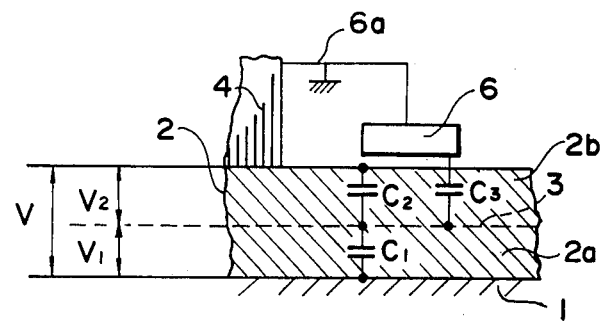
FIG. 2 shows an equivalent circuit of the semiconductor layer and the electric field sensor shown in FIG. 1A.

With reference to the attached drawings, the first embodiment of the present invention will be described hereinbelow. FIG. 1A shows only a single hexagonal coil 10 used as a rotating machine stator winding. These hexagonal coils are arranged being fitted to coil grooves formed in the inner circumference of the iron core.

The coil 10 is composed of a plurality of rectangular coil conductors 1, an insulation layer 2 covering the coil conductors 1, and semiconductor layers 3 formed within the insulation layer 2 so as to surround the coil conductor 1, as depicted in FIG. 1B.

The semiconductor layer 3 is formed, covering from the contact position of the coil 10 with the iron core 4 to the coil end at which coil terminal lead wires are taken out, by winding a semiconductor taper or sheet 3 around the cross section of the hexagonal coil 10, as shown in FIG. 1B. This semiconductor layer 3 serves as an insulation deterioration detection layer as described in greater detail later. It is preferable to form the semiconductor layer 3 within the coils of several turns on the line source voltage sides 1, as shown in FIG. 1C, in the case of three-phase Y-connection. Further, the semiconductor layer 3 is formed on the coil sides and at the coil end of the coil 10 as shown in FIG. 1D, because an electric field is usually concentrated to the coil end in particular and thus the insulation may first deteriorate, and additionally an electric field sensor 6 (described later) can easily be mounted. However, the semiconductor layer 3 is formed extending to near the end of the iron core 4 and to a position at which the electric field sensor can easily be mounted.

As shown in FIG. 1A, an electric field sensor 6 of Pockels element is provided with a pair of electrodes (not shown) for detecting voltages and a pair of optical fibers 6c for conducting light into or from the sensor 6. In the case of the first embodiment shown in FIG. 1A, one sensor electrode is in contact with the outer surface of the coil (opened), while the other electrode is grounded by an electrode wire 6a.

FIG. 2 shows an equivalent circuit of the above-mentioned sensor electrodes in relation to the coil conductor 1, the insulation layer 2, the semiconductor layer 3, and the iron core (grounded), in which an electrostatic capacitance $C_1$ is formed between the semiconductor layer 3 and the coil conductor 1 or within an inner insulation layer 2a; an electrostatic capacitance $C_2$ is formed between the semiconductor layer 3 and the outer surface of the insulation layer 2 or within an outer insulation layer 2b; and an electrostatic capacitance $C_3$ is formed between the semiconductor layer 3 and one sensor electrode, respectively. Further, the other sensor electrode is connected to the iron core 4 grounded.

In the same drawing, two voltages $V_1$ and $V_2$ divided by the semiconductor layer 3 can be expressed as:

$$V_1 = V \times \frac{C_2}{C_1 + C_2} = V \times \frac{1}{1 + C_1/C_2}$$

$$V_2 = V \times \frac{C_1}{C_1 + C_2} = V \times \frac{1}{1 + C_2/C_1}$$

where V is the voltage between the coil conductor 1 and the iron core (ground) 4; $V_1$ is the voltage between the semiconductor layer 3 and the coil conductor 1; $V_2$ is the voltage between the semiconductor layer 3 and the iron core 4.

In the equivalent circuit shown in FIG. 2, in the case where the inner insulation layer 2a is shorted ($C_1 = \infty$) between the semiconductor layer 3 and the coil conductor 1 because the insulation is eroded by partial electric discharge or for some reason or other, the voltage $V_1$ is zero and the voltage $V_2$ is V; that is, the potential is the same at both the coil conductor 1 and the semiconductor layer 3. Therefore, a higher electric field is applied to the opened sensor electrode, because a high potential approaches the electrode. In contrast with this, in the case where the outer insulation layer 2b is shorted ($C_2 = \infty$) between the semiconductor layer 3 and the iron core 4, the voltage $V_1$ is V and the voltage $V_2$ is zero. Therefore, a lower electric field is applied to the opened sensor electrode, because a high potential becomes away from the electrode.

The magnitude of the electric field at the open electrode can be adjusted by changing the thickness of an insulator 5 shown in FIG. 1, that is, by changing the capacitance $C_3$.

The above-mentioned change in electric field can be detected by the Pockels element 6 fixedly disposed on the outer surface of the insulation layer 2 of the coil 10 and near one end of the coil via the insulator 5. This sensor element 6 is fixed by an insulation material such as polyester tape.

Figure 3:
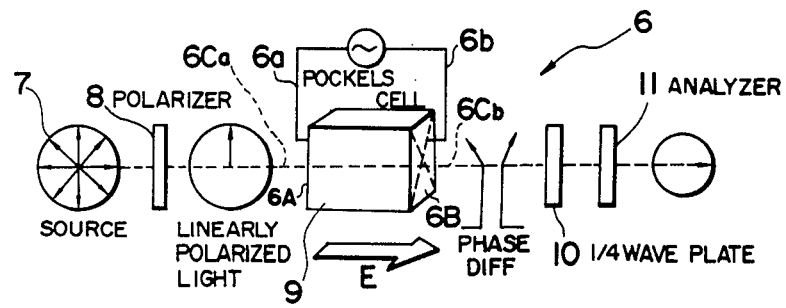
FIG. 3 is a diagrammatical view showing the principle of the Pockels electric field sensor.

The principle of the Pockels electric field sensor element according to the present invention will be described hereinbelow with reference to FIGS. 3 and 4. The sensor element 6 is made up of a light source 7, a polarizer 8, a Pockels cell 9, a quarter wave plate 10, and an analyzer 11, in addition to two optical fibers 6c. The polarizer 8 changes the natural light into a linearly polarized light. The Pockels cell 9 is a kind of optical modulator based on Pockels effect called linear electrooptic effect, in which refractive index changes linearly in proportion to the electric field intensity applied across the two electrodes of the cell 9. The quarter wave plate 10 is a complex refracting plate the thickness of which is so determined as to produce a quarter (¼) optical path difference between a first linearly polarized light incident thereupon and a second linearly polarized light passed therethrough in the direction perpendicular to the first linearly polarized light. The analyzer 11 is a kind of the polarizer for detecting the presence or absence of polarized light or the orientation of the polarized light. In the present embodiment, the Pockels cell 9 is of BSO (bismuch silicon oxide) type.

Therefore, the light emitted from the light source 7 is polarized into a linearly polarized light through the polarizer 8. When the polarized light is passed through the Pockels cell 9, since the refractive index of the cell changes according to the electric field applied thereto, the linearly polarized light is modulated so as to produce optical phase difference according to the intensity of the electric field. The light passed through the Pockels cell 9 is further passed through the quarter wave plate 10 in order to obtain only the polarized light having a quarter optical path difference relative to the incident polarized light. The analyzer 11 passes only the polarized light having a predetermined orientation.

As described above, it is possible to change the intensity of polarized light passed through the analyzer 11 according to the intensity of electric field applied to the Pockels cell 9. Further, in this embodiment, the electric field is applied to two transparent electrodes (indium oxide) disposed perpendicular to the optical pass; that is, the direction of the optical path is in parallel with that of the applied electric field. Further, the input impedance of the Pockels cell 9 is 100 Mohn or more.

Figure 4:
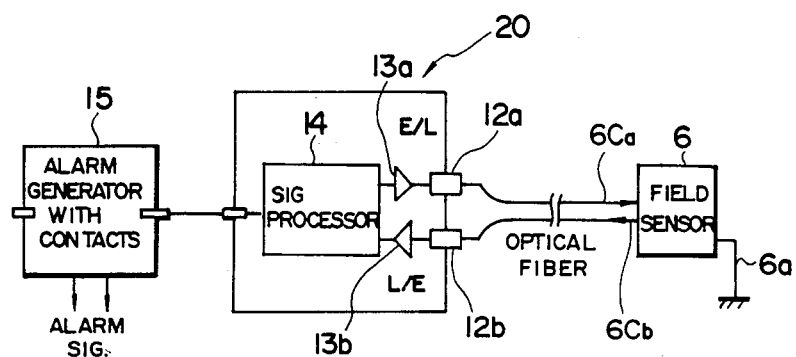
FIG. 4 is a schematic block diagram of the insulation detecting means connected to the Pockels electric field sensor shown in FIG. 3.

FIG. 4 shows an insulation detector 20 connected to the Pockels electric field sensor 6. The detector 20 is composed of a pair of optical couplers 12a and 12b, an electricity-light transducer 13a, a light-electraicity transducer 13b, and a signal processor 14. The signal processor 14 generates a light source signal. The light source signal is transduced into a light beam through the electricity-light transducer 13a and then allowed to be incident upon one electrode of the Pockels cell 9 through the optical coupler 12a and the optical fibers 6C$_a$. The light modulated by the Pockels cell 9 according to the electric field thereto is guided to the light-electricity transducer 13b through the optical fiber 6C$_b$ and the optical coupler 12b and then applied to the signal processor 14 to amplify the transduced sensor signal. This sensor signal is further applied to an alarm generator 15 in order to compare it with reference values. In case the voltage level of the sensor signal is above a first upper limit reference value; that is, when the insulation between the semiconductor layer 3 and the coil conductor 1 (within the inner layer 2a) is shorted, an upper limit contact provided within the alarm generator 15 is actuated to generate first alarm signal. In case the voltage level of the sensor signal is below a second lower limit reference value; that is, when the insulation between the semiconductor layer 3 and the iron core 4 (within the outer layer 2b) is shorted, a lower limit contact provided within the alarm generator 15 is actuated to generate a second alarm signal. Further, it is also possible to adopt a microcomputer in place of the alarm generator 15 in order to detect the change in voltage of the sensor signal caused by insulation deterioration and to produce alarm signals or to cut off the power source applied to the machine.

The monitoring apparatus according to the present invention can discriminate the inner insulation layer deterioration between the semiconductor layer 3 and the coil conductor 1 and the outer insulation layer deterioration between the semiconductor layer 3 and the iron core 4. However, in practice, the inner insulation layer deterioration usually occurs more often than the outer insulation layer deterioration, as far as the semiconductor layer 3 is not formed extremely on the side of the iron core. This is because the area between the semiconductor layer 3 and the coil conductor 1 is near the conductor 1 to which a high voltage is applied. Further, in the case where this area deteriorates to some extent in insulation, even if not shorted, it may be reasonable to consider that the insulation layer 2 has already served its life time, and therefore should be replaced with new one.

In the above description, the resistance of the semiconductor layer 3 is very important. The preferable range thereof lie from $10^2$ and $10^7$ ohm-cm. The reason is as follows: If the resistance is below $10^2$ ohm-cm, eddy-current loss increases in the semiconductor layer 3 and therefore the layer 3 is heated excessively. This eddy current is readily generated in the semiconductor layer 3 due to an alternating magnetic field developed when a high alternating voltage is passed through the coil conductor 1.

Figure 5:
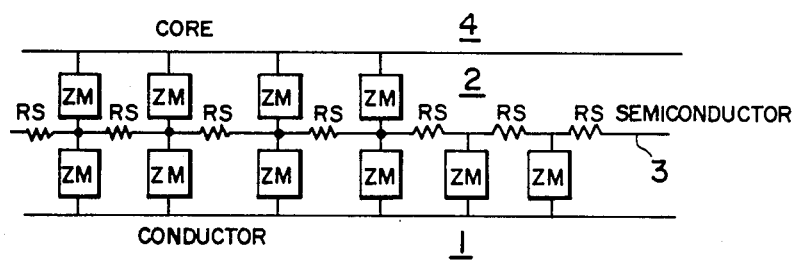
FIG. 5 shows an equivalent circuit of the semiconductor layer and the coil insulation layer shown in FIG. 1A or 1B.

On the other hand, if the resistance is above $10^7$ ohm-cm, it is impossible to detect the insulation deterioration detween the semiconductor layer 3 and the coil conductor 1 or between the semiconductor layer 3 and the iron core 4. In further detail, FIG. 5 shows an equivalent circuit within the insulation layer 2, in which RS denotes the distribution resistance of the semiconductor layers 3 and ZM denotes the distribution impedance ($10^{10}$ to $10^{16}$ ohm-cm) between the semiconductor layer 3 and the coil conductor 1 or the iron core 4. In the above equivalent circuit, it is preferable that the ZM is sufficiently higher than RS. This is because when the RS is excessively high, since the semiconductor layer 3 may serve as a part of the insulation layer 2, it becomes difficult to produce a sufficient difference in the electric field applies across the Pockels cell electrodes between when the semiconductor layer 3 and the coil conductor 1 are shorted and when the semiconductor layer 3 and iron core 4 are shorted.

Figure 6:
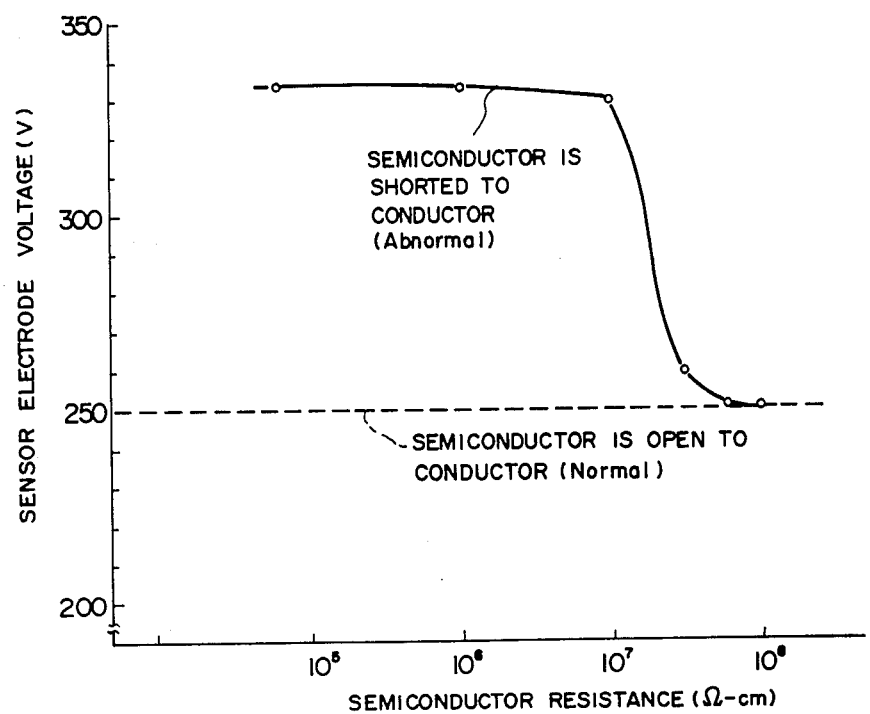
FIG. 6 is a graphical representation representative of the relationship between semiconductor resistance and the sensor electrode voltage developed when the semiconductor layer is shorted to the coil conductor in an abnormal state.

FIG. 6 shows experimental results of the dependence of the semiconductor layer resistance upon the Pockels cell sensor electrode voltage. In this experiment, an aluminum pipe of 22 mm diameter is used as a conductor 1 of a model coil and this aluminum conductor pipe 1 is shorted to the semiconductor layer 3. Further, a voltage of 2 kV (AC) is applied between the iron core 4 and the conductor 1 or the semiconductor layer 3. Further, in FIG. 6, the dashed line indicates a sensor electrode voltage obtained when the aluminum conductor pipe 1 is opened to the semiconductor layer 3 in the normal insulation condition.

This graphical representation indicates that when the resistance of the semiconductor layer 3 increases beyond $10^7$ ohm-cm, the sensible voltage obtained when the semiconductor layer 3 is shorted to the aluminum conductor pipe 1 is reduced abruptly approaching the dash line which is developed when the semiconductor layer 3 is opened relative to the aluminum conductor pipe 1. When the characteristic curve approaches the dashed line, it is impossible to distinguish the abnormal insulation (conductor 1 is shorted to semiconductor layer 3) from the normal insulation (conductor 1 is open to semiconductor layer 3), in particular, beyond $10^7$ ohm-cm.

Experiment results of the monitoring apparatus shown in FIG. 1A will be described hereinbelow. The insulation layer 2 of model coils used for this experiment is formed by winding a powder mica tape (powdered mica is bonded onto an insulation substrate) four turns around the cross section of the coil in half-lap winding method (half of the width of the insulation tape is overlapped with each other). The semiconductor tape (A carbon tape) 3 of $10^3$ ohm-cm in resistance is formed between the first and second insulation layers of the powder mica tape (referred to as Model coil A) or between the second and third insulation layers (referred to as Model coil B) in butt-joint winding method (tape edges are in contact with each other). The semiconductor layer 3 is formed extending from the coil side position where the coil is in contact with the iron core 4 to the coil end (right side in FIG. 1A) of the hexagonal coil. Further, a 0.3-mm dia. bare wire is connected to the semiconductor layer 3 at the opposite coil end (left side in FIG. 1A) and taken out as a lead for measurement. These two model coils A and B are both assembled with a model iron core (made of aluminum) (however, referred to as iron core, hereinafter), respectively. The coil and the iron core are both put within a vessel including epoxy resin, and the vessel is evacuated and then pressurized in order to impregnate the coil with epoxy resin. Thereafter, the epoxy resin is heated for hardening.

Table 1 below shows electrostatic capacitances between the conductor 1 and the iron core 4, between the semiconductor layer 3 and the conductor 1, and between the semiconductor layer 3 and the iron core 4 in the above two model coils A and B.

TABLE 1

|  | Conductor and iron core | Semiconductor and conductor | Semiconductor and iron core |
| --- | --- | --- | --- |
| Model A | 494 PF | 1712 PF | 690 PF |
| Model B | 517 PF | 17012 PF | 1050 PF |

The Pockels electric field sensor 6 is attached on the insulation layer 2 via an about 8-mm thick insulator 5 (glass epoxy laminated plate) on the side of one coil (right side in FIG. 1A) of the coil under which the semiconductor layer 3 is formed. The sensor 6 is connected to the insulation detector 20 (shown in FIG. 4) via a pair of optical fibers 6c. As shown in FIG. 1A, one of the Pockels cell electrode is shorted by an electrode wire 6a to the iron core or the ground, while the other of the electrode is open near the outer surface of the insulation layer 2. Under these conditions, voltages of 1, 2, 3 and 4 kV are applied between the conductor 1 and the iron core 4 in three conditions where the semiconductor layer 3 is open; where the semiconductor layer 3 is shorted to the conductor 1; and where the semiconductor layer 3 is shorted to the iron core 4, being classified according to the presence and absence of the insulator 5 and according to the model coils A and B. Table 2 below shows the change in sensed voltage level (V) obtained by the signal processor 14.

TABLE 2

| Voltage of processor (V) | | Voltage between conductor and core | | | |
| --- | --- | --- | --- | --- | --- |
| | | 1 kV | 2 kV | 3 kV | 4 kV |
| Model Coil A | | | | | |
| No Insulator | Semicon. open | 147 | 292 | 449 | 500 |
| | Semicon. and cond. short | 204 | 406 | 500 | 500 |
| | Semicon. and core short | 7 | 12 | 18 | 24 |
| 8 mm Insulator | Semicon. open | 117 | 236 | 359 | 486 |
| | Semicon. and cond. short | 166 | 338 | 500 | 500 |
| | Semicon. and core short | 9 | 18 | 27 | 36 |
| Model Coil B | | | | | |
| No Insulator | Semicon. open | 95 | 195 | 293 | 394 |
| | Semicon. and | 186 | 371 | 500 | 500 |

TABLE 2-continued

| Voltage of processor (V) | | Voltage between conductor and core | | | |
| --- | --- | --- | --- | --- | --- |
| | | 1 kV | 2 kV | 3 kV | 4 kV |
| | cond. short | | | | |
| | Semicon. and core short | 7 | 13 | 19 | 25 |
| 8 mm Insulator | Semicon. open | 68 | 138 | 207 | 278 |
| | Semicon. and cond. short | 136 | 269 | 406 | 512 |
| | Semicon. and core short | 7 | 13 | 19 | 25 |

Figure 7:
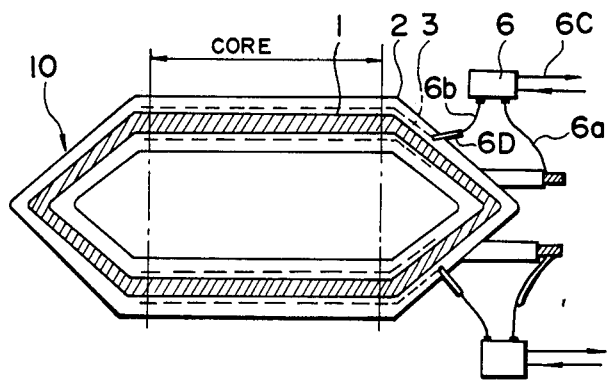
FIG. 7 is a diagrammatical cross-sectional view, partly side views, of a first modification of the first embodiment of the monitoring apparatus according to the present invention.

FIG. 7 shows a first modification of the first embodiment of the monitoring apparatus according to the present invention, in which a first sensor electrode is directly connected to the coil conductor 1 through the first electrode wire 6a and a second sensor electrode is directly connected to the semiconductor layer 3 through the second electrode wire 6b and a conductor 6D.

When a voltage V is applied to the coil inductor 1, the following voltage $V_1$ is developed between the coil conductor 1 and the semiconductor layer 3 as already explained:

$$V_1 = V \times \frac{C_2}{C_1 + C_2}$$

In case the insulation near the conductor 1 is eroded due to partial discharge and therefore deteriorates into insulation breakage, the above voltage $V_1$ becomes zero. In response to this zero voltage signal, an alarm is produced. In usual, since the insulation between the semiconductor layer 3 and the iron core 4 is not deteriorated so quickly as that between the semiconductor layer 3 and the conductor 1, it is possible to previously prevent a complete insulation layer breakage accident only by detecting the deterioration between the conductor 1 and the semiconductor layer 3.

TABLE 3

| Voltage between conductor and core | 1 kV | 2 kV | 3 kV | 4 kV |
| --- | --- | --- | --- | --- |
| Model B Without insulator | | | | |
| Semicon. open | 105 V | 214 V | 321 V | 32 V |
| Semicon and conductor shorted | 15 | 29 | 43 | 58 |
| Semicon. and core shorted | 199 | 400 | 500 | 500 |

The above table 3 indicates that when the semiconductor layer 3 is shorted to the conductor 1, a lower voltage is detected, in contrast with the results shown in Table 2. Further, as understood with reference to Tables 2 and 3, it is possible to change the sensor sensitivity by connecting the one sensor electrode with either of the iron core 4 (ground) or the conductor 1.

Further, when both the sensor electrodes are open without being connected to the ground or the conductor 1, the change in sensor voltage can be detected through an electrostatic capacitance formed between the electrode and the ground; in this case, however, the sensor sensitivity is relatively low. On the other hand, when one electrode is connected to the ground or the conductor 1, the change in sensor voltage can be directly detected between the conductor 1 (open side) and the ground or between the conductor 1 (open side) and the semiconductor layer 3, so that the sensor sensitivity is relatively high.

Further, when one sensor electrode is grounded, a shared voltage between the semiconductor layer 3 and the grounded iron core 4 is applied to the sensor 6; when one sensor electrode is connected to the conductor, a shared voltage between the semiconductor layer 3 and the conductor 1 is applied to the sensor 6. In other words, the above two methods can properly be used according to the intensity of the voltage applied to the coil. Additionally, in the manufacturing process, it is very easy to make the sensor electrode open, and relatively easy to make the sensor electrode grounded, but relatively difficult to connect the sensor electrode to the conductor.

The other experimental results of this first modification will be described. The forming conditions of the coil are almost the same as described in the model coil A of the first embodiment. The electrode wire 6b is directly connected to the semiconductor layer 3 and the electrode wire 6a is directly connected to one of coil lead wires.

When an alternating voltage 18 kV is applied between the coil conductor 1 and the iron core 4, the voltage developed between the coil conductor 1 and the semiconductor layer 3 is about 6.2 kV, the shared ratio between 34.4%. When the above voltage is kept applied, the above shared voltage drops the zero volts after about 100 hours. further, after about 140 hours, the insulation between the coil conductor 1 and the iron core 4 is broken into short.

Figure 8:
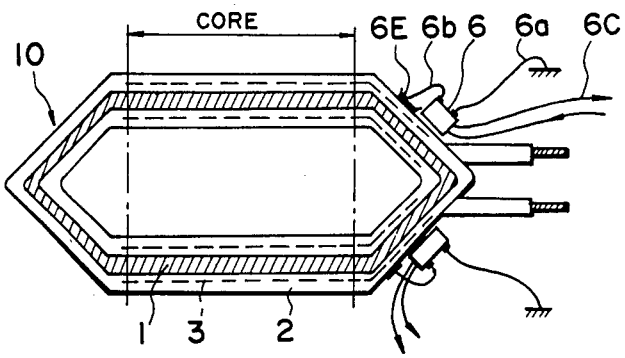
FIG. 8 is a diagrammatical cross-sectional view, partly side view, of a second modification of the first embodiment of the monitoring apparatus according to the present invention.

FIG. 8 shows a second modification of the first embodiment of the monitoring apparatus according to the present invention, in which a first sensor electrode is connected to the ground through the first electrode wire 6a and a second sensor electrode is connected to a band-shaped sensor electrode 6E formed by winding an aluminum foil around the cross section of the coil in contact with the insulation layer 2 so as to surround a part of the semiconductor layer 3.

The experiment, the conditions that the test coil is formed are almost the same as described in the model coil B of the first embodiment. To form the band-shaped electric field sensor electrode 6E, an aluminum foil of 40 mm or 20 mm in width are used. This foil 6E is wound on the insulation layer 2 so as to surround the semiconductor layer 3. Further, a 0.3-mm dia. bare copper wire is wound around the aluminum foil as an electrode wire 6b so as to be connected to the Pockels electric field sensor 6.

Table 4 shows the electrostatic capacitances measured at each position.

TABLE 4

| Electrode width | Cond. and core | Cond. and semi. | Core and semi. | Cond. and electrode | Semi. and electrode |
|---|---|---|---|---|---|
| 40 mm | 519 PF | 1017 PF | 1055 PF | 61.5 PF | 66.6 PF |
| 20 mm | 519 PF | 1017 PF | 1055 PF | 39.9 PF | 42.2 PF |

Under these conditions, an alternating voltage of 500 V is applied between the coil conductor 1 and the iron core 4, and the sensor voltage is measured in three conditions where the semiconductor layer is open, where the semiconductor layer 3 is shorted to the conductor 1 and where the semiconductor layer 3 is shorted to the iron core 4. The experimental results are shown in Table 5 below.

TABLE 5

| Electrode width | Semicond. open | Semi. and cond. shorted | Semi. and core shorted |
|---|---|---|---|
| 40 mm | 229 (V) | 448 (V) | 6 (V) |
| 20 mm | 212 | 419 | 8 |

Further, the resistance of the semiconductor layer tape (A carbon) is changed from about $10^3$ ohm-cm to about $10^4$ ohm-cm and a 0.1-mm thick and 40-mm wide aluminum foil is wound to form the sensor electrode 6E. Under these conditions, a voltage about 4.5 times higher than the ordinary operating voltage is applied continuously between the coil conductor 1 and the iron core 4. After about 100 hours, the insulation between the coil conductor 1 and the semiconductor layer 3 is deteriorated almost into short. In this embodiment, an alarm generator 15 provided with an upper limit contact and a lower limit contact is connected to the signal processor 14. These contacts are so set to be actuated when the signal processor 14 outputs two signals indicative of abnormality in the voltage level sensed by the Pockels electric field sensor 6. When these contacts are closed, the power source to the machine is cut off. Therefore, if the preset voltages of the upper and lower limit contacts are adjusted, it is possible to cut off the power source of the machine when the insulation layer 2, in particular, between the semiconductor layer 3 and the coil conductor 1 is almost deteriorated near short or when is perfectly broken into short. Here, even if the insulation layer 2 is perfectly broken between the semiconductor layer 3 and the coil conductor 1, since the insulation layer 2 is still serviceable between the semiconductor layer 3 and the iron core 4, it is possible to previously prevent an insulation breakage accident. However, in such a case as described above, the insulation layer 2 should be renewed for safety.

Figure 9:
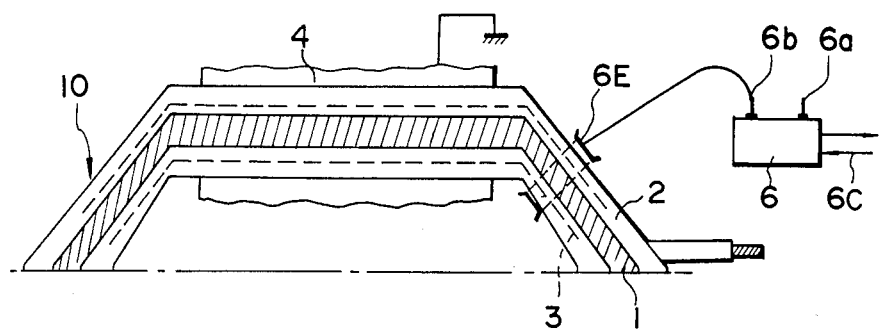
FIG. 9 is a diagrammatical cross-sectional view, partly side view, of a third modification of the first embodiment of the monitoring apparatus according to the present invention.

FIG. 9 shows a third modification of the first embodiment of the monitoring apparatus according to the present invention, in which the first sensor electrode is open and the second electrode is connected to the band-shaped sensor electrode 6E shown in FIG. 8. The coil 10 is formed in the same conditions as described in the second modification explained with reference to FIG. 8. In experiment, an alternating voltages of 1, 2, 3, and 4 kV is applied between the coil conductor 1 and the iron core 4, in place of 500 V in the second modification. The experimental results are shown in Table 6 below:

TABLE 6

| Electrode width | Measuring conditions | Voltage between cond. and core | | | |
|---|---|---|---|---|---|
| | | 1 kV | 2 kV | 3 kV | 4 kV |
| 40 mm | Semicon. open | 31 V | 61 V | 92 V | 123 V |
| | Semi. and cond. shorted | 65 | 131 | 197 | 263 |
| | Semi. and core shorted | 4 | 6 | 91 | 22 |
| 40 mm | Semicon. open | 30 | 60 | 91 | 122 |
| | Semi. and cond. shorted | 64 | 128 | 193 | 253 |
| | Semi. and core shorted | 3 | 4 | 6 | 8 |

Figure 10:
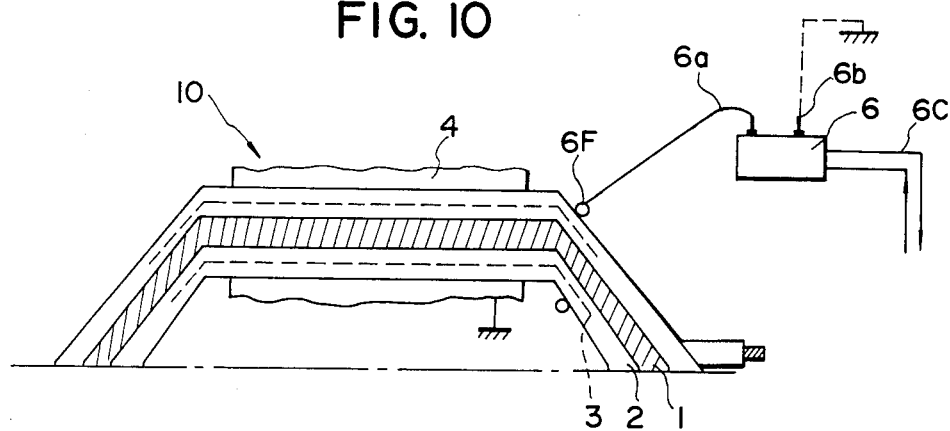
FIG. 10 is a diagrammatical cross-sectional view, partly side view, of a fourth modification of the first embodiment of the monitoring apparatus according to the present invention.

FIG. 10 shows a fourth modification of the first embodiment of the monitoring apparatus according to the present invention, in which the first sensor electrode is connected through an electrode wire 6a to a single-turn silicon rubber insulated electric wire 6F wound around the cross section of the coil 10 in contact with the insulation layer 2 so as to surround a part of the semiconductor layer 3 and the second sensor electrode (6b) is open or grounded to the iron core 4.

In experiment, the conditions that the test coil is formed are almost the same as described in the model coil B of the first embodiment. The silicon rubber insulation wire 6F is 4 mm in outer diameter and 1.5 mm in wall thickness. This wire is wound at a position about 30 mm apart from the edge of the iron core 4 on the end portion of the coil. Further, the wire can be wound in series around plural adjacent coils in such a way as to be interwoven crisscross between each pair of coils. One end of the wire is open and the other end thereof is connected to the Pockels sensor 6 through the electrode wire 6b. To accelerate the insulation deterioration, a voltage about 4.5 times higher than the ordinary operating voltage is applied between the coil inductor 1 and the iron core 4 (grounded). Further, an attenuator (not shown) in the signal processor 14 is so adjusted as to generate a detection voltage of 300 V when the insulation is normal. This detection voltage is applied to the alarm generator 15. In the alarm generator 15, there is provided an analog-type meter relay voltmeter, in which an upper limit contact is closed in response to the detection voltage of 350 V and a lower limit contact is closed in response to the detection voltage of 250 in order to cut off the power supply voltage in both the cases. Under these conditions, it has been confirmed that the upper limit contact is actuated after about 234 hours, indicating that the coil conductor 1 is shorted to the semiconductor layer 3. Further, in the case where the preset voltage in the upper limit contact is changed to 450 V and the same voltage is kept applied therebetween, the lower limit contact is actuated to cut off the power source after about 236 hours in total, indicating that the coil conductor 1 is broken into short to the iron core 4.

Further, voltages of 1, 2, 3 and 4 kV are applied to between the coil conductor 1 and the iron core 4. The experimental results are shown in Table 7 below:

TABLE 7

| Measuread conditions | Voltage between conductor and core | | | |
|---|---|---|---|---|
| | 1 kV | 2 kV | 3 kV | 4 kV |
| Semi. open | 71 V | 143 V | 212 V | 280 V |
| Semi. and cond. shorted | 106 | 205 | 305 | 400 |
| Semi. and core shorted | 41 | 83 | 124 | 166 |

Figure 11A:
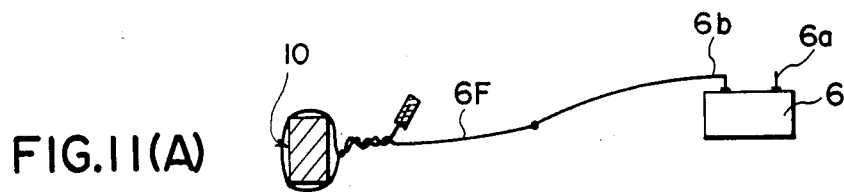
FIGS. 11(a), (b), (c), and (d) are illustrations showing the methods of winding an insulated wire around a coil or coils in the first embodiment of the monitoring apparatus according to the present invention.
Figure 11B:
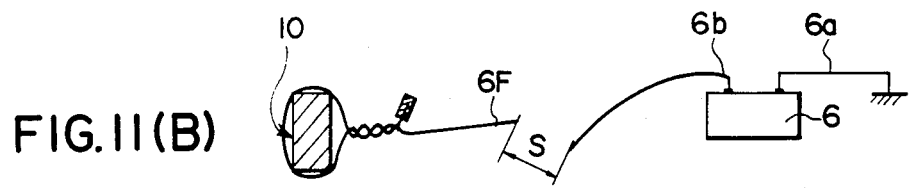
Figure 11C:
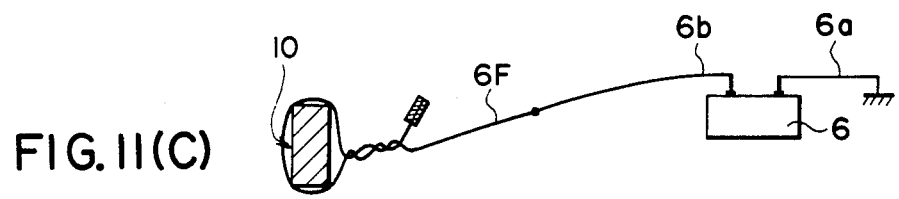

FIGS. 11(a), (b), and (c) show the states where the silicon rubber insulation wire 6F is wound around a single coil. In FIG. 11(a), the first sensor electrode is open; in FIGS. 11(b) and (c), the first sensor electrode is grounded; but, in FIG. 11(b), the insulation wire 6F is disconnected at the junction point with the electrode terminal wire 6b, indicating that two wires 6F and 6b can be coupled with each other via a stray capacitance. This allowable distance S is from 1 to 500 mm.

In the above first to fourth modifications except the one shown in FIG. 1A, only the sensor electrode is mounted on the coil and connected to the sensor 6. Therefore, there exists an advantage that it is unnecessary mount the Pockels sensor 6 itself on the coil.

Figure 11D:
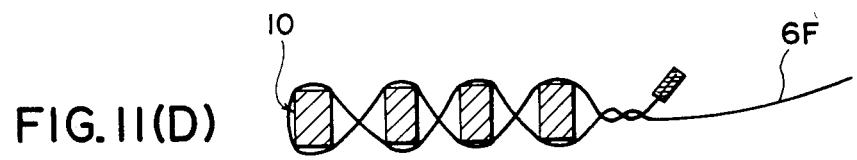

Further, FIG. 11(d) shows the case where a single silicon rubber wire 6F is wound by a single turn around four different coils so as to be interwoven crisscross between each pair of coils. In this case, it is possible to monitor the insulation deterioration of four coils at the same time.

FIG. 12 shows a second embodiment of the insulation deterioration monitoring apparatus according to the present invention, in which the change in electric field due to insulation deterioration is detected by a ferroelectric element in place of a Pockells cell disclosed in the first embodiment.

As shown in FIG. 12, the ferroelectric element 6A is mounted on the outer insulation layer 2 formed on the coil 10, and an alarm generator 15 is directly connected to the ferroelectric element 6A.

With reference to FIGS. 13(a) and (b), the principle that the voltage of the ferroelectric element 6A changes according to the electric field applied thereto will be described hereinbelow. When no electric field is applied to the ferroelectric element 6A, since the direction of spontaneous polarization domains are random as depicted in FIG. 13(a), no potential difference is developed across the element 6A. In contrast with this, when an electric field is applied thereto, since the directions of spontaneous polarization domains are arranged in the direction parallel to the electric field as depicted in FIG. 13(b), a potential difference is developed across the element 6A. Further, the above "polarization" implies that when an electric field is applied to an ferroelectric substance, positive or negative electric charges or ions are arranged in a predetermined direction, so that a dipole moment is generated. The relationship between the potential difference V and the electric field E can be expressed as $V = Ae^E$ (A: constant).

Therefore, the above potential difference changes exponentially according to the change in electric field. Further, the above spontaneous polarization domains can be reversed in response to a high frequency alternating electric field, the response speed being on the order from millisecond to microsecond. In the present invention, a PZT piezoelectric element is adopted for the ferroelectric element, by way of example.

As already described, in case the insulation layer 2a between the semiconductor layer 3 and the coil inductor 1 is eroded due to partial discharge into short ($V_1 = 0$), the potential of the semiconductor layer 3 increases to a potential ($V_2 = V$) the same as that of the coil inductor 1. Therefore, a higher electric field is applied to the ferroelectric element 6A, so that the element 6A generates a higher potential corresponding to the applied electric field. In this case, a current passed through the internal impedance within the element 6A also increases. Therefore, it is also possible to detect the insulation deterioration within the insulator layer 2a by detecting the change in voltage or current of the element 6A with the alarm generator 15 provided with the measuring circuit.

On the other hand, in case the insulation layer 2b between the semiconductor layer 3 and the iron core 4 is shorted ($V_2 = 0$), the potential of the semiconductor layer 3 decreases to a potential ($V_1 = V$) the same as that of the iron core 4. Therefore, a lower potential is applied to the ferroelectric element 6A, so that the element 6A generates a low voltage corresponding to the applied electric field. That is, it is possible to detect the insulation deterioration within the insulation layer 2b by detecting the change in voltage or current of the element 6A.

Figure 14:
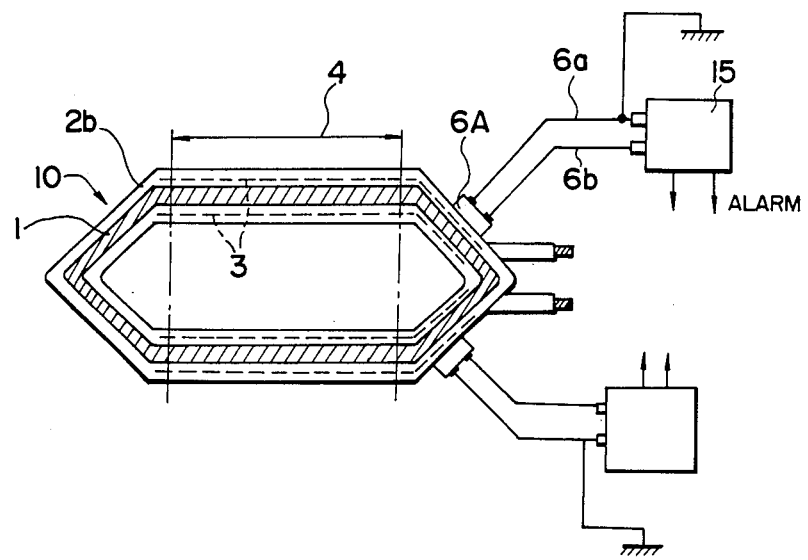
FIG. 14 is a diagrammatical cross-sectional view, partly side view, of the second embodiment of the monitoring apparatus according to the present invention, in which a semiconductor layer and an electric field sensor of ferroelectric type are provided for a coil.

FIG. 14 shows the coil 10 and the ferroelectric element 6A more practically. The element 6A is mounted on the insulation layer 2 under which the semiconductor layer 3 is formed, directly or indirectly via an insulator (not shown). The element 6A is connected to the alarm generator 15 through two sensor wires 6a and 6b. It is preferable to use the alarm generator 15 having an input impedance of 1 megaohm or more. The alarm generator 15 may be of analog or digital type. Further, it is also possible to connect the sensor wire 6a to the ground. The alarm generator 15 is provided with an upper limit contact and a lower limit contact. When the inner insulation layer 2a is shorted, since a high voltage is applied across the element 6A, the upper limit contact is actuated to produce a first alarm; when the outer insulation layer 2b is shorted, since a low voltage is applied across the element 6A, the lower limit contact is actuated to produce a second alarm. Further, it is also possible to cut off the power source of the coils in response to the first and second alarms, before the coils are brought into an accident.

Further, in place of the alarm generator 15 with contacts, it is also possible to use a voltmeter or volt recorder. In these cases, the insulation deterioration can be detected by visual inspection. Furthermore, it is also possible to use an ampere meter or current recorder. The present embodiments can also be adopted for monitoring the insulation deterioration of coils arranged in dry-type transformers, mold-type power transformers, mold-type current transformers, etc. as well as rotating machines.

Experimental results of the monitoring apparatus shown in FIG. 14 will be described hereinbelow. The coils of two models A and B are formed in the same conditions as described in the first embodiment. The PZT piezoelectric element (ferroelectric element 6A) of 1 mm in thickness and 20 mm in diameter is fixed on the insulation layer 2 (2b) near the coil end directly or indirectly via an about 8-mm thick insulator (glass epoxy laminated plate) by use a polyester tape. Further, the sensor terminal wire 6a is connected to the ground iron core 4.

Table 8 shows the sensor voltages when voltage of 1, 2, 3 and 4 kV are applied between the coil conductor 1 and the iron core 4.

TABLE 8

| Mounting conditions | Measurement condition | Voltage between core and coil | | | |
|---|---|---|---|---|---|
| | | 1 kV | 2 kV | 3 kV | 4 kV |
| Model coil A | | | | | |
| Without insulator | Semicon open | 0.59 V | 1.20 V | 1.89 V | 2.50 V |
| | Semicon-coil short | 0.83 V | 1.68 V | 2.64 V | 3.87 V |
| | Semicon-iron short | 0.05 V | 0.10 V | 0.15 V | 0.20 V |
| With 8-mm insulator | Semicon open | 0.39 V | 0.81 V | 1.24 V | 1.69 V |
| | Semicon-coil short | 1.56 V | 1.17 V | 1.82 V | 2.54 V |
| | semicon-iron short | 0.05 V | 0.09 V | 0.14 V | 0.19 V |
| Model coil B | | | | | |
| Without insulator | Semicon open | 0.40 V | 0.85 V | 1.29 V | 1.75 V |
| | Semicon-coil short | 0.84 V | 1.72 V | 2.81 V | 4.50 V |
| | Semicon-iron short | 0.04 V | 0.08 V | 0.12 V | 0.16 V |
| With 8-mm insulator | Semicon open | 0.32 V | 0.68 V | 1.05 V | 1.43 V |
| | Semicon-coil short | 0.64 V | 1.36 V | 2.19 V | 3.18 V |
| | semicon-iron short | 0.04 V | 0.09 V | 0.13 V | 0.18 V |

Table 8 indicates that it is possible to descriminate whether the short position is on the conductor side or on the iron core side on the basis of an increase or decrease in detected sensor voltage. Further, it is also possible to adjust the sensitivity of the voltmeter in dependence upon the thickness of the insulator or the presence or absence thereof.

Further, the ferroelectric element 6A is mounted on the coil via an insulator of 10 mm in thickness and a voltage about 4.5 times higher than the ordinary operating voltage is applied between the coil conductor 1 and the iron core 4. Under these conditions, the voltage developed across the ferroelectric element 6A is 200 mV (AC). In order to cut off the power source when the detected voltage changes or more than about ±30 percent, the upper limit contact is so set as to be closed when the element voltage is 260 mV, while the lower limit contact is so set as to be closed when the element voltage is 140 mV. In this case, the upper limit contact is actuated after about 234 hours, indicating that the insulation 2a is shorted between the semiconductor layer 3 and the coil conductor 1. Thereafter, the upper limit contact is set to 450 mV and the lower limit contact is set so 50 mV. In this case, the lower limit contact is actuated after about 236 hours in total, indicating that the insulation 2b is shorted between the semiconductor layer 3 and the iron core 4.

Further, Table 9 shows the experimental results obtained when the change in electric field can be detected by the ferroelectric element 6A in the form of current.

TABLE 9

| Mounting conditions | Measurement condition | Voltage between core and coil | | | |
|---|---|---|---|---|---|
| | | 1 kV | 2 kV | 3 kV | 4 kV |
| Without insulator | Semicon open | 16 μA | 34 μA | 53 μA | 73 μA |
| | Semicon-coil short | 35 μA | 75 μA | 156 μA | 249 μA |
| | Semicon-core short | 1 μA | 3 μA | 5 μA | 8 μA |
| With 8-mm insulator | Semicon open | 4 μA | 12 μA | 20 μA | 30 μA |
| | Semicon-coil short | 8 μA | 22 μA | 36 μA | 50 μA |
| | semicon-core short | 1 μA | 2 μA | 3 μA | 5 μA |

This table 9 indicates that it is possible to descriminate the short positions, that is, whether a short occurs on the conductor side or the iron core side in dependence upon an increase or a decrease in the detected sensor current. Further, it is also possible to adjust the sensitivity of the ampere meter in dependence upon the presence or absence or the thickness of the insulator.

Further, the ferroelectric element 6A is mounted on the coil via an insulator of 10 mm in thickness and a voltage about 4.5 times higher than the ordinary operating voltage is applied between the coil conductor 1 and the iron core 4. Under these conditions, the current passed through the ferroelectric element 6A is 120 μA (AC). In order to cut off the power source when the detected current changes more than about ±30 percent, both the limit contacts are set. In this case, the upper limit contact is actuated after about 234 hours, indicating that the semiconductor layer 3 is shorted to the coil conductor 1.

As described above, in the insulation deterioration monitoring apparatus according to the present invention, the advantages are:

(1) It is possible to specify the insulation deterioration position within the insulation layer 2; that is, whether the insulation is deteriorated between the semiconductor layer 3 and the coil conductor 1 (on the coil side) or the iron core 4 (on the core side).

(2) The sensitivity of the sensor element 6 and 6A can be adjusted by changing the thickness of the insulator 5 disposed under the sensor element.

(3) It is possible to selectively detect the position at which the insulation layer is most often and quickly deteriorated.

(4) It is possible to detect only a single coil insulation deterioration from among a plurality of coils.

(5) It is possible to produce an alarm before the whole insulation layer 2 is broken, thus it being possible to previously and securely prevent a serious short accident.

(6) So far, the safety factor is excessively determined by increasing the thickness of the insulation. However, it is possible to adopt a minimum safety factor and to minimize the thickness of the insulation layer and thus the size of the machine.

(7) The user can reduce the maintenance cost such as insulation test, while increasing the reliability.

On the other hand, in the first embodiment, (1) Since an optical fiber can be used, the sensor is safe.

(2) Since an insulation detecting wire is wound around a coil or coils, this is safe and the manufacturing steps are simple.

In the second embodiment, (1) The insulation deterioration can be detected in the form of voltage or current.

It will be understood to those skilled in the art that the foregoing description is in terms of a preferred embodiment of the present invention wherein various changes and modifications may be made without departing from the spirit and scope of the invention, as set forth in the appended claims.

What is claimed is:

1. An apparatus for use with an electric coil placed in an iron core, the electric coil having a coil conductor and an electric insulator surrounding the coil conductor to provide a predetermined degree of electric insulation between the coil conductor and the iron core, comprising:
   (a) a semiconductor layer provided at least in a portion of the electric insulator to divided the electric insulator portion into outer and inner layers and;
   (b) a sensor provided on the coil, the sensor being sensitive to an electric field existing therearound for producing a sensor signal indicative of a sensed electric field intensity when a voltage is applied between the coil conductor and the iron core; and
   (c) a detector responsive to the sensor signal for detecting a deterioration of the electric insulation of the electric insulator.

2. The apparatus as claimed in claim 1, wherein the semiconductor layer has a resistance value ranging from $10^2$ to $10^7$ ohm-cm.

3. The apparatus as claimed in claim 1, wherein the detector includes means for setting a predetermined range defined by upper and lower limits, means for providing an indication of an electric insulation deterioration of the electric insulator upper layer when the sensor signal has a level smaller than the lower limit, means for providing an indication of an electric insulation deterioration of the electric insulator lower layer when the sensor signal has a level greater than the upper limit.

4. The apparatus as claimed in claim 3, wherein the detector includes means for providing an alarm when the sensor signal has a level out of the predetermined range.

5. The apparatus as claimed in claim 3, wherein the detector includes means for terminating the application of the voltage between the coil conductor and the iron core when the sensor signal has a level out of the predetermined range.

6. The apparatus as claimed in claim 1, wherein the sensor includes a Pockels electric field sensor for producing an optical signal indicative of the sensed electric field intensity.

7. The apparatus as claimed in claim 6, wherein the Pockels electric field sensor includes a light source for emitting a light, a Pockels element having a bismuth silicon oxide element sandwiched between first and second electrodes for sensing an electric field, the Pockels element optically connected to the light source for modulating the light to an optical phase difference corresponding to the intensity of the sensed electric field applied between the first and second electrodes, and means for converting the optical phase difference into the sensor signal.

8. The apparatus as claimed in claim 7, wherein the first electrode is grounded and the second electrode is placed on the electric insulator.

9. The apparatus as claimed in claim 7, wherein the first electrode is grounded and the second electrode is placed through an insulating member on the electric insulator.

10. The apparatus as claimed in claim 7, wherein the first electrode is connected to the iron core and the second electrode is free.

11. The apparatus as claimed in claim 7, wherein the first electrode is connected to the coil conductor and the second electrode is free.

12. The apparatus as claimed in claim 7, wherein the first electrode is connected to the coil conductor and the second electrode is connected to the semiconductor layer.

13. The apparatus as claimed in claim 7, wherein the first electrode is grounded and the second electrode is connected to a conductive strip wound around the electric insulator at a position facing to the semiconductor layer.

14. The apparatus as claimed in claim 7, wherein the first electrode is free and the second electrode is connected to a conductive strip wound around the electric insulator at a position surrounding the semiconductor layer.

15. The apparatus as claimed in claim 7, wherein the first electrode is free and the second electrode is connected to a conductive strip wound around the electric insulator at a position surrounding the semiconductor layer.

16. The apparatus as claimed in claim 7, wherein the first electrode is connected to an insulated electric wire wound around the electric insulator at a position surrounding the semiconductor layer and the second electrode is grounded.

17. The apparatus as claimed in claim 7, wherein the first electrode is connected to an insulated electric wire wound around the electric insulator at a position surrounding the semiconductor layer and the second electrode is free.

18. The apparatus as claimed in claim 1, wherein the sensor includes a ferroelectric element for producing a sensor signal indicative of the sensed electric field intensity.

19. The apparatus as claimed in claim 18, wherein the detector includes means for setting a predetermined range defined by upper and lower limits, means for providing an indication of an electric insulation deterioration of the electric insulator upper layer when the sensor signal has a level smaller than the lower limit, means for providing an indication of an electric insulation deterioration of the electric insulator lower layer when the sensor signal has a level greater than the upper limit.

20. The apparatus as claimed in claim 19, wherein the detector includes means for providing an alarm when the sensor signal has a level out of the predetermined range.

21. The apparatus as claimed in claim 19, wherein the detector includes means for terminating the application of the voltage between the coil conductor and the iron core when the sensor signal has a level out of the predetermined range.

22. The apparatus as claimed in claim 19, wherein the ferroelectric element is mounted on the electric insulator outer layer.

23. The apparatus as claimed in claim 19, wherein the ferroelectric element is mounted through an insulator on the electric insulator outer layer.

* * * * *